(12) United States Patent
Estrada

(10) Patent No.: US 8,164,498 B2
(45) Date of Patent: Apr. 24, 2012

(54) PROPER FREQUENCY PLANNING IN A SYNTHETIC INSTRUMENT RF SYSTEM

(75) Inventor: Anthony J. Estrada, San Diego, CA (US)

(73) Assignee: BAE Systems Information Solutions Inc., Arlington, VA (US)

( * ) Notice: Subject to any disclaimer, the term of this patent is extended or adjusted under 35 U.S.C. 154(b) by 56 days.

(21) Appl. No.: 12/879,666

(22) Filed: Sep. 10, 2010

(65) Prior Publication Data
US 2012/0062302 A1 Mar. 15, 2012

(51) Int. Cl.
*H03M 1/00* (2006.01)
(52) U.S. Cl. .......................... 341/123; 455/115
(58) Field of Classification Search .................. 341/123; 455/115; 706/29, 47, 50; 370/252; 327/100; 714/32
See application file for complete search history.

(56) References Cited

U.S. PATENT DOCUMENTS
2011/0090807 A1* 4/2011 Caudill et al. ............... 370/252

OTHER PUBLICATIONS

Anthony Estrada, Noise Concerns and Remedies in VXI and PXI Systems Systems, IEEE AutoTestCon 2008.
Robert Lowdermilk and Frederic Harris, Signal Conditioning and Data Collection in Synthetic Instruments, AutoTestCon 2003.
Anthony Estrada, Improving High Speed Analog to Digital Converter Dynamic Range by Noise Injection, Auto TestCon 2007.
Mark Rives, Intermediate Frequency (IF) Sampling Receiver Concepts, http://www.national.com/nationaledge/mar06/article.html, Jul. 27, 2010.

* cited by examiner

*Primary Examiner* — Joseph Lauture
(74) *Attorney, Agent, or Firm* — Sand & Sebolt; Joseph A. Sebolt; Rodney E. Haven

(57) ABSTRACT

A system and method for clocking in analog-to-digital (ADC) converter in a synthetic instrument unit is presented. A method begins by applying an input clock to an amplifier to produce an amplified clock. The amplified clock is filtered to produce a filtered clock. The ADC of this synthetic instrument unit is clocked with the filtered clock. The input frequency of the ADC corresponds to a second or higher order Nyquist zone that is above the sampling frequency of the ADC. The input data is carried by an intermediate frequency (IF) signal. The filtered clock of ADC is switched off a clock path of the ADC when the ADC is not in use.

20 Claims, 6 Drawing Sheets

PROPER FREQUENCY PLANNING IN A SYNTHETIC INSTRUMENT RF SYSTEM

BACKGROUND OF THE INVENTION

1. Field of Invention

The current invention relates generally to apparatus, systems and methods for synthetic instruments. More particularly, the apparatus systems and methods relate to clocks for synthetic instruments. Specifically, the apparatus, systems and methods relate to amplifying and filtering clocks for use in synthetic instruments.

2. Description of Related Art

Synthetic Instrument (SI) units are modern measurement and stimulus systems. Unlike traditional instrumentation systems, the SI user may not be constrained by legacy frequency plans. Traditional downconverter frequency plans were born from technology available in the 1960s and 1970s. High frequency gain was either not available or was very expensive. Therefore, the bulk of the system's gain was obtained at a relatively low Intermediate Frequency (IF) and was usually passed along to the Analog-to-Digital Converter (ADC). Typical IF choices were 455 KHz, 10.7 MHz or 21.4 MHz, for example, which led to large filter components in order to meet rejection requirements. Low loss, sharp transition filters required large, low loss elements. In the past, these constraints were not a problem because other system components were of comparable size. Narrow filters were the norm because data bandwidth requirements were minimal.

As RF technology has improved, it is now possible to obtain more of the system gain at higher frequencies. Broadband, flat frequency response components are now available. The rapid technological advancement in the cellular telephone industry generated thousands of new, low cost microwave amplifiers, filters, and switches. At the same time, the speed and quality of ADCs has improved. From a round 1995 to 2003 ADCs used for low band operation improved from 12-bits at 41MSPS to 12-bits at 400MSPS. In 2009, the benchmark was 16-bits at 200MSPS. That is a 20:1 improvement in 14 years.

Present signal bandwidth requirements are much wider because the type of data transmission has changed. To make a practical architecture, it is necessary to limit the bandwidth percentage for a given IF frequency because it avoids the risks of filter induced, phase distortion and makes physical realization possible. The same filter design that obtains sharp attenuation properties does so at the expense of large phase changes over the filter's passband. A SI must support legacy analog as well as high speed digital signals. Therefore, frequency and time domain characteristics can both be important.

This goal is difficult to meet when using an IF and frequency plan with an IF designed to pass narrow bandwidth signals. An SI-based system is not compartmentalized into the stand alone architecture of legacy measurement hardware. The SI concept is to share functional blocks to perform multiple tasks with a limited number of blocks. The newer components of a modern synthetic instrument system provide for designing the RF channel based on the signal requirements of SI. Thus, there is a need for an improved synthetic instrumentation system.

SUMMARY OF THE INVENTION

The preferred embodiment of the invention includes a method of generating an analog-to-digital converter (ADC) sampling clock for an SI system. The preferred embodiment improves the clocking of the ADC in a synthetic instrument to improve the noise floor and dynamic range of a synthetic instrument system. The method begins by amplifying an input clock to produce an amplified clock. This amplified clock is then filtered to produce a filtered clock. Preferably, the amplified clock is filtered with a narrow bandpass filter that can be a second order filter. The ADC of the synthetic instrument is clocked with the filtered clock to sample the input data at a sampling frequency. The input data is carried by an intermediate frequency (IF) signal and can have an input frequency that corresponds to a second or higher Nyquist zone so that the input frequency is above the sampling frequency of the ADC. The method switches the filtered clock off a clock path of the ADC when the ADC is not in use. When there is input data for the ADC to filter, the method switches the filter clock onto the path of the ADC so that the ADC can sample the input data. This switching can improve the noise floor of more than 15 dB over a significant bandwidth.

In another configuration of the preferred embodiment, the method clocks the ADC that is an ADC formed with integrated circuits in a silicon chip. In this configuration, the amplifying amplifies an input clock that is received externally from the chip. In one configuration of this embodiment, the method can select a center IF which carries the data input to the ADC. The ADC can then sample the input data at the center IF. The method can then also select the input clock based, at least in part, on the center IF.

A second embodiment is a method for frequency planning a synthetic instrument unit. The method begins by selecting an intermediate frequency (IF) that is carrying input data. Selecting the IF can be an iterative process that is successful when the system bandwidth, the dynamic range (DR), sampling clock of an ADC and other features of the SI are radically synchronized.

Next, a system bandwidth (BW) of the synthetic instrument unit is determined. After this, a determination is made to determine if the system BW is above a first tolerance. The IF is adjusted when the system BW is not above the first tolerance to produce an updated IF. When the system BW is above the first tolerance, the method will select an analog-to-digital converter (ADC) sampling clock. This clock is selected based, at least in part, on the updated IF. A bandpass filter is selected to filter the ADC sampling clock based, at least in part, on the ADC sampling clock frequency. The bandpass filter may be a narrowband filter.

In other configurations of the second embodiment, an amplifier is selected that is capable of amplifying the ADC sampling clock prior to filtering the ADC sampling clock. An ADC can also be selected based on the IF where the ADC can be used to filter the input data based on the ADC sampling clock frequency. The IF and the ADC sampling clock can be selected so that the IF has a frequency that is about four times greater than the ADC sampling clock frequency.

In addition to determining if the BW is satisfactory, the method can also determine if a BW of the ADC is satisfactory. If the system BW is not satisfactory, then the IF is adjusted to produce an updated IF. The determining if the BW of the ADC is within a BW window is performed after selecting an intermediate IF. The method can also determine if the dynamic range (DR) of the input data is satisfactory. The IF is adjusted when the DR is not within the DR window to produce an updated IF.

A third embodiment comprises a synthetic instrument logic for reducing the noise on the sampling clock of an analog-to-digital converter (ADC). The synthetic instrument logic includes an ADC configured to digitally sample input data at an intermediate frequency (IF). The input frequency of the ADC is in a Nyquist zone above the frequency of the filtered clock. The synthetic instrument unit includes an amplifier configured to amplify an input clock to create an amplified clock. A narrowband bandpass filter is configured to filter the amplified clock to create a filtered clock with a frequency corresponding to the frequency of the input. The filtered clock is used to clock the ADC. The amplified clock is filtered before being input to the ADC. The SI logic includes switch logic and control logic. The switch logic is configured to connect the filtered clock to the ADC and to disconnect the filtered clock to the ADC. The control logic configured to control the switching logic to connect the filter clock to the ADC when the ADC is to sample the input data and to disconnect the filter clock from the ADC when there is no input data to sample.

BRIEF DESCRIPTION OF SEVERAL VIEWS OF THE DRAWINGS

One or more preferred embodiments that illustrate the best mode(s) are set forth in the drawings and in the following description. The appended claims particularly and distinctly point out and set forth the invention.

The accompanying drawings, which are incorporated in and constitute a part of the specification, illustrate various example methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

Similar numbers refer to similar parts throughout the drawings.

DETAILED DESCRIPTION

A modern synthetic instrumentation (SI) and legacy hardware do share one feature. Both depend on reference frequencies and clock synchronization connections. The LOs (local oscillators) used to translate frequency signals to the desired band must be derived from a lower frequency system reference using a PLL (phase locked loop). Other operations, performing vector measurements for example, force the requirement to have analog-to-digital converter (ADC) sampling clock phase locked to the system reference as well. In other words, the SI must operate with all processing or frequency translation elements in synchronization to process coherent inputs.

In a legacy component these choices have been made and are hidden. The user only has access to an input and output signal. With the SI, many of the details of the system frequency plan are now in control of the SI system designer. This is not a liability and it is a huge advantage that the SI system offers.

Selecting a different frequency plan is an advantage because of the added flexibility that can be achieved. However, several solutions often exist to process the RF signal. System bandwidth, possible compatibility with external signals, available ADC clock frequencies, and dynamic range must all be considered. The technical challenges might seem overwhelming. The ADC parameters affect the possible intermediate frequency (IF) inputs. The IF signal properties affect the choice for the ADC. The problem would be circular and ambiguous, except for the fact that there is a starting point. The signal bandwidth, dynamic range, or SNR (Signal-to-Noise Ratio) are usually known quantities at the outset.

Figure 1:
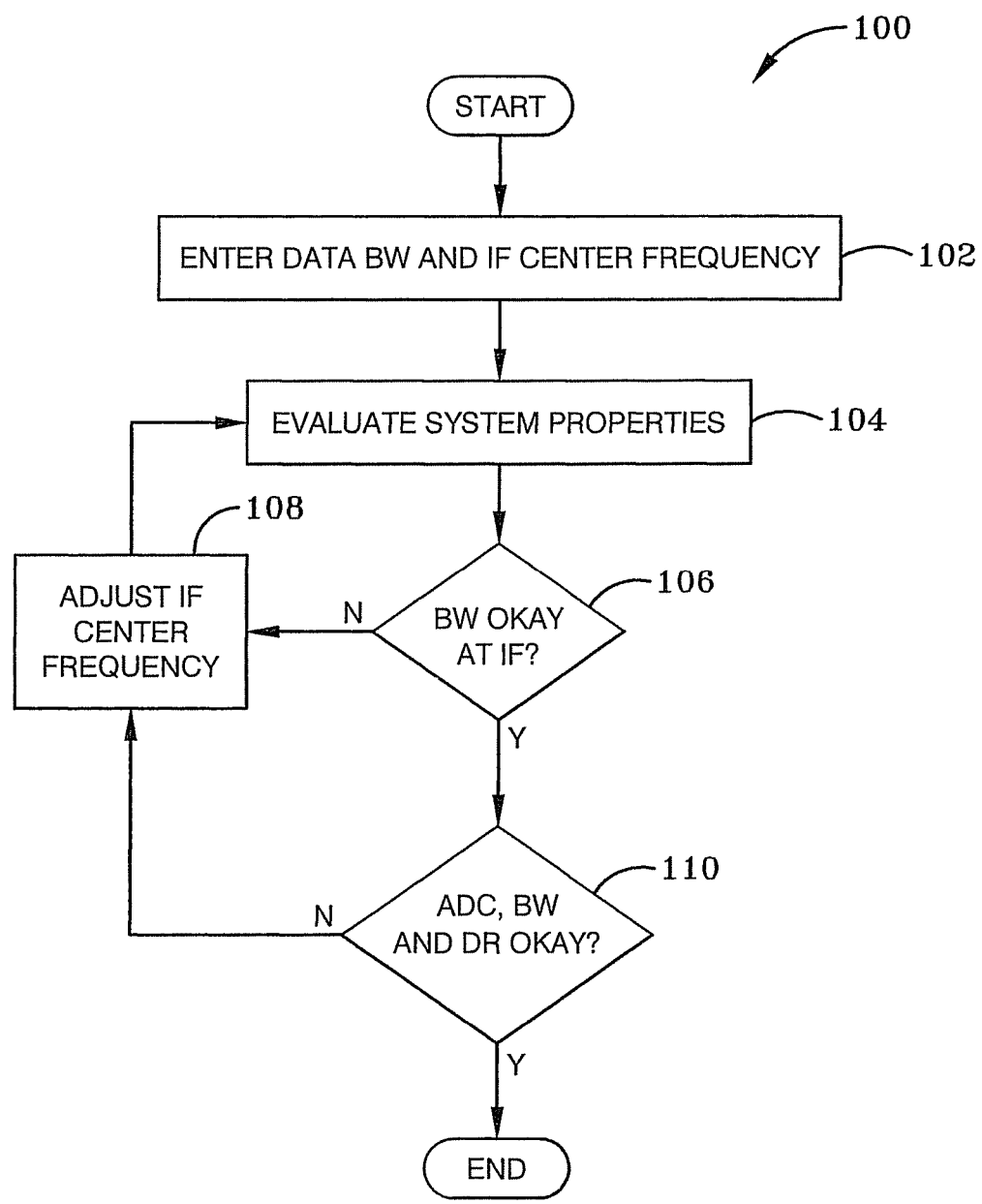
FIG. 1 illustrates a preferred embodiment of a method for frequency planning a synthetic instrument unit RF system.

FIG. 1 illustrates the first embodiment of a method 100 used to plan the intermediate frequency (RF) and the bandwidth of and analog-to-digital converter (ADC). For purposes of simplicity of explanation, FIG. 1 and the other illustrated methodologies of other figures are shown and described as a series of blocks. It is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

FIG. 1 illustrates the interaction between the IF bandwidth, IF center frequency, and the interaction of the ADC sampling clock selection. The process converges once the input signal bandwidth properties are well defined. A benefit of the SI design is that the IF and ADC can be designed for current and future needs. With legacy systems, there is often no mechanism for an upgrade path. For example, a faster ADC might be available in the future. Improvements in SNR might result, but there is generally no way to increase system bandwidth and data throughput.

As shown in FIG. 1, the process of selecting the IF center frequency and bandwidth is straightforward. The IF center and bandwidth are set based on input signal and bandwidth requirements. The method 100 begins by entering the data bandwidth (BW) and IF center frequency, at 102. Next, system properties of the base IS are evaluated, at 104. System properties may include things such as the hardware architecture of the SI unit, the type of ADC implemented in the SI unit, and other system properties as understood by those of ordinary skill in the art.

A determination is made, at 106, to determine if the system bandwidth is supported by the selected IF center frequency. If the system bandwidth is not supported by the IF center frequency, then the IF center frequency is adjusted, at 108. If the system bandwidth is supported by the IF center frequency, then a determination is made, at 110, to determine if the ADC bandwidth and dynamic range (DR) are satisfactory. If these values are satisfactory, then a sampling clock of the ADC may be determined as discussed later. If these values are not satisfactory, then the IF center frequency can be adjusted, at 108.

A few examples based on FIG. 1 will now be discussed. Suppose that an initial IF is chosen to be 20 MHz, and that and synthetic instrumentation system uses a 10 MHz reference frequency. Also suppose that reasonable phase linearity is important across the full system bandwidth. Since the 10 MHz reference energy might be strong and difficult to remove by filtering, it may be prudent to limit the bandwidth to less than 20 MHz to allow for adequate filtering.

Figure 2:
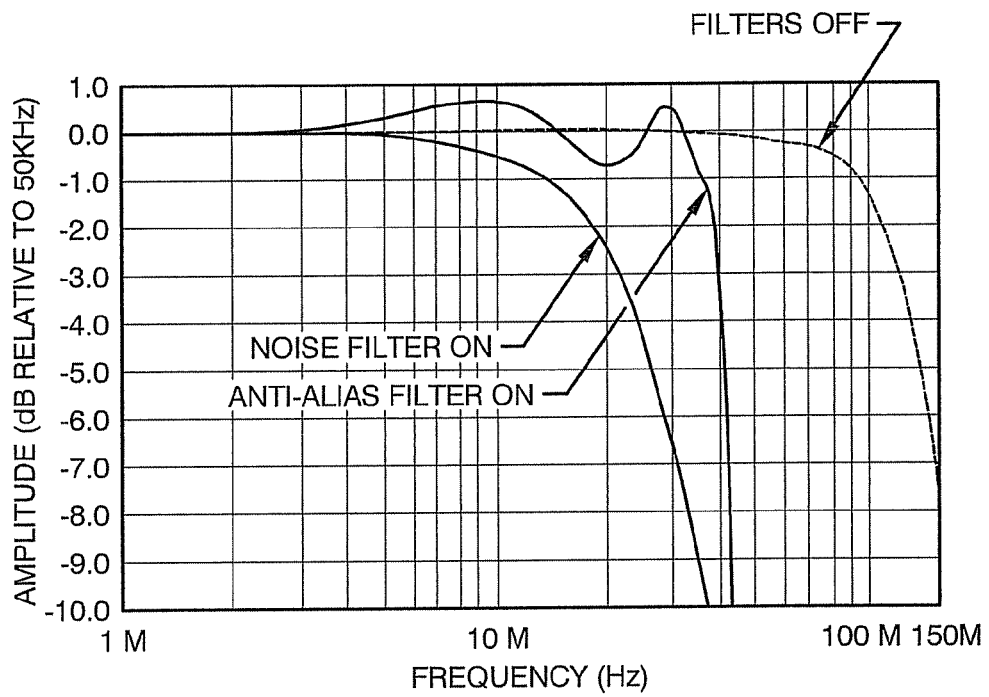
FIG. 2 illustrates the input bandwidth profile for the National Instruments PXIe-5122 ADC.

An input gain profile for the National Instruments PXIe-5122 ADC is shown in FIG. 2. This model is an example of an ADC with good dynamic range and input signal bandwidth. The internal clock rate is 100 MHz by default. This ADC also offers selectable input filtering. The flattest response is obtained by turning off all input filtering. The anti-aliasing filter has an elliptic cutoff profile to attenuate signals above 40 MHz. If a synthetic instrument system used this filter, the signal bandwidth may have to be restricted to less than 10 MHz to avoid filter-induced phase distortion.

It may be a better choice would be to use the ADC with external filtering. By using this external filtering, a designer of the synthetic instrument system could ensure that there would be good amplitude flatness and minimal phase distortion. Another improvement would be to move the IF from 20 MHz to 25 MHz. Doing so would center the data at $f_{clk}/4$, an ideal ratio for signal processing. The SI system could support a signal bandwidth of at least 20 MHz without affecting data quality. If the synthetic instrument system required more bandwidth, then a higher IF frequency would likely be required.

Figure 3:
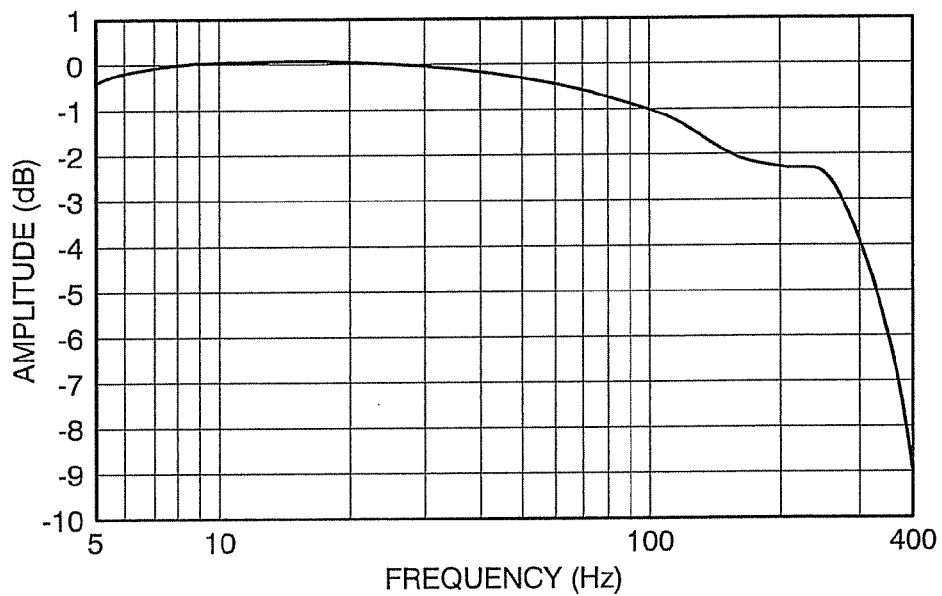
FIG. 3 illustrates the input bandwidth profile for the National Instruments PXIe-5622 ADC.

A higher speed ADC with a 150 MHz clock rate is shown in FIG. 3. To follow the $f_{clk}/4$ concept, the IF is scaled to 37.5 MHz. While not as flat as the PXIe-5122's input profile, this synthetic instrument system would perform well with a 40 MHz signal bandwidth. If more phase distortion (PD) could be tolerated, this ADC could also be used in the second Nyquist zone centered at 112.5 MHz. The energy would alias (or mirror) to the same 37.5 MHz center after sampling.

The input bandwidth of the ADC is one factor that affects the performance of a synthetic instrument system. The details of determining whether the dynamic range of the ADC is acceptable, at 110 in FIG. 1, are now discussed. The dynamic range (DR) of the ADC and hence the synthetic instrument system is a function of the clock frequency, the Nyquist zone of operation, and the quality of the ADC sampling clock. The quality of the SI can be enhanced or degraded depending on ADC configuration.

Some general guidelines on the dynamic range of ADCs include:

DR is improved with lower ADC input frequencies
DR is improved in the first Nyquist zone over other zones
DR rises as the ADC clock rises but only up to a point The dynamic range (DR) changes because the spurious levels are a function of input frequency and the ADC sampling clock frequency. The sample and hold detector used in the ADC will produce less error when the input frequency is a low percentage of the ADC sampling frequency. If the clock ADC sampling frequency is too high, the sample and hold error will also increase. Therefore, ADCs generally have an optimal window of input and sampling frequencies to obtain the best dynamic range.

A trade-off occurs as increasing bandwidth requirements force the IF center frequency to increase while spurious levels also rise. At higher frequencies, the phase error in the ADC's sample and hold becomes a larger percentage of the input waveform.

Figure 4:
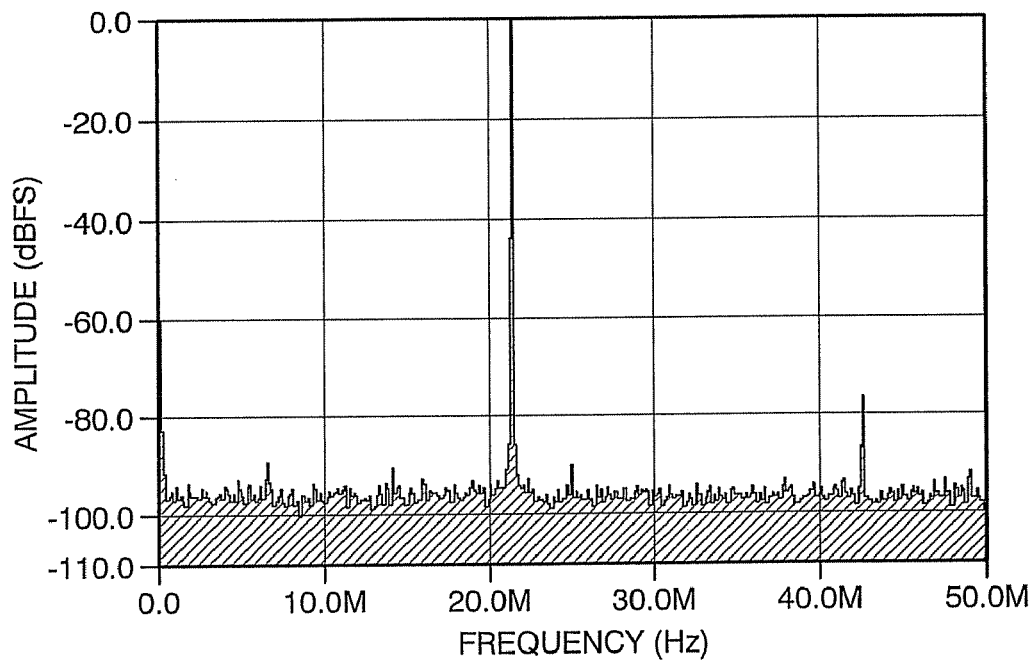
FIG. 4 illustrates a 14-bit analog-to-digital converter (ADC) with a 21.4 MHz input and a 100 MHz clock.
Figure 5:
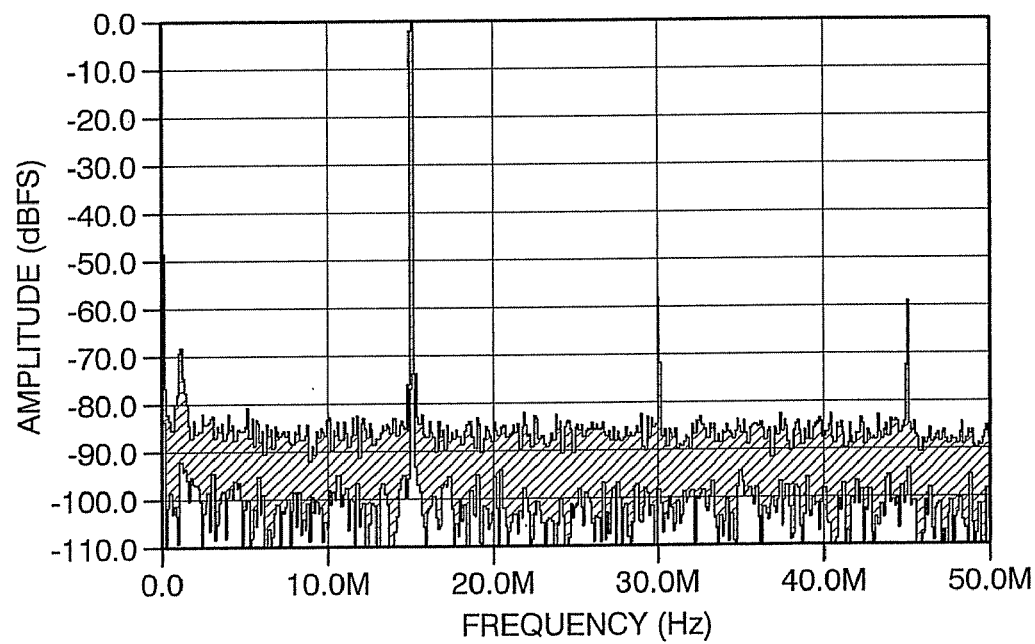
FIG. 5 illustrates a 14-bit ADC with an 85 MHz input and a 100 MHz clock.

FIGS. 4 and 5 compare the same ADC with a sample clock of 100 MHz operating in the first and second Nyquist zones, respectively. Both show final outputs in the 15 MHz-21 MHz range. However, the data in FIG. 4 reflects a noise floor improvement of 10 dB over the $2^{nd}$ Nyquist zone plot shown FIG. 5.

The larger spurious signals are harmonic and clock image related. Operating in the higher Nyquist zones does increase these products. Reducing signal harmonics or other spurious signals at the ADC input is critical when operating in higher Nyquist zones. When working in the SI environment additional filtering is easily added.

After the IF center frequency, ADC, and other parameters have been selected, the SI system performance can be improved further by reducing noise content in the ADC sampling clock. Noise at this point directly affects the ADC's sample and hold performance. An external clock source allows for efficient signal conditioning.

Figure 6:
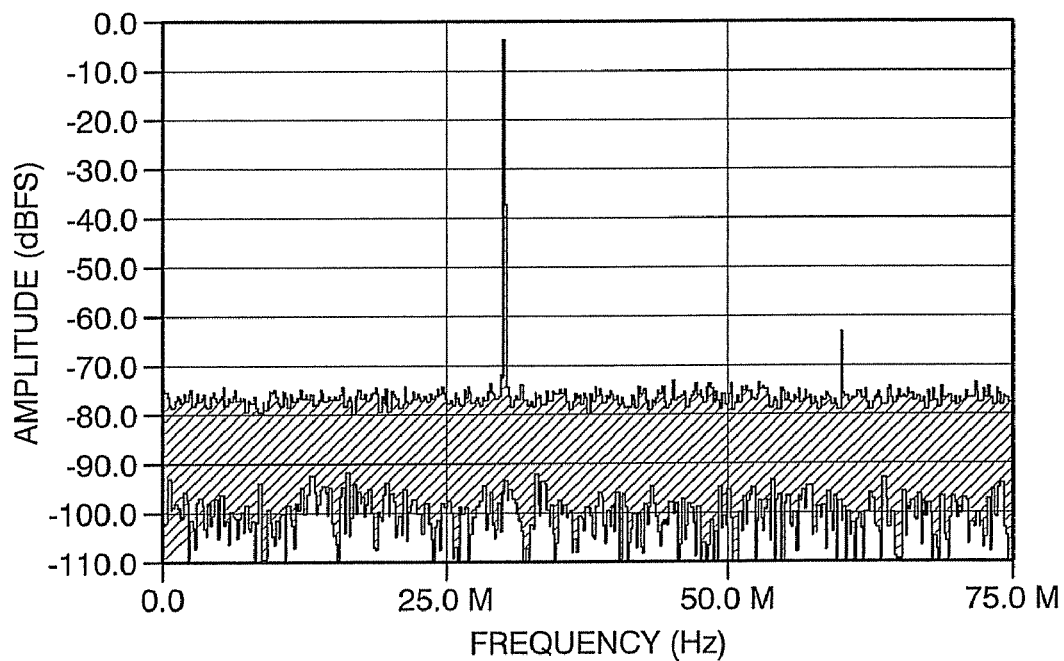
FIG. 6 illustrates a National Instruments PXIe-5622 ADC with a 180 MHz input and a 150 MHz external clock without filtering.
Figure 7:
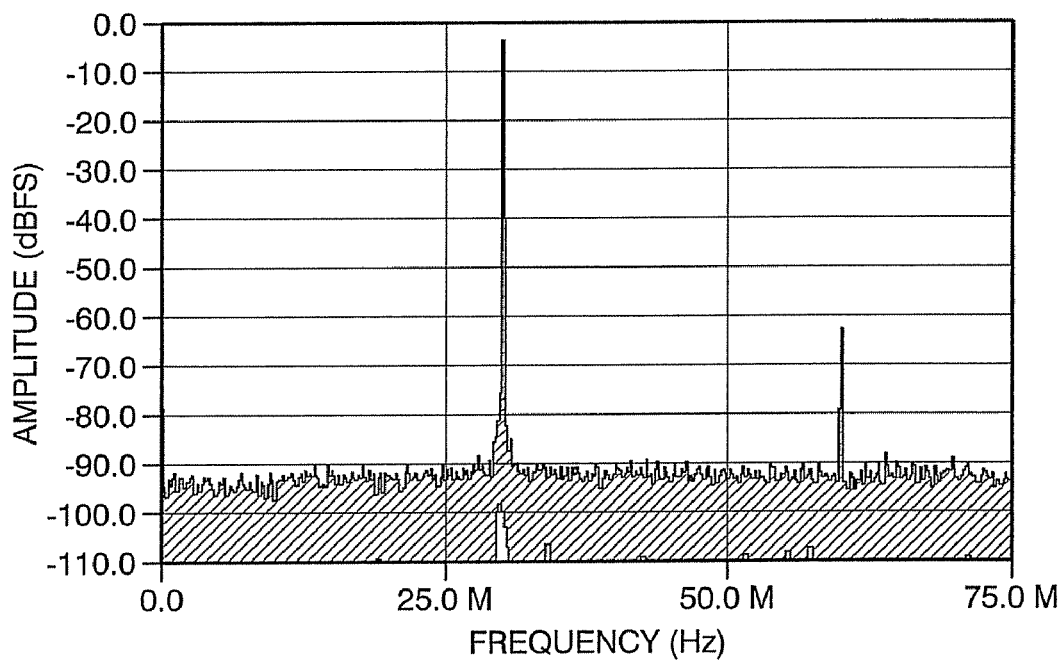
FIG. 7 illustrates a National Instruments PXIe-5622 ADC with a 180 MHz input and a 150 MHz external clock using a narrow bandpass filter.

FIGS. 6 and 7 illustrate the difference in the noise floor and the dynamic range between an un-filtered sample clock (FIG. 6) and a filtered sample clock (FIG. 7). Both tests use an input frequency in the third Nyquist zone well above the ADC's sampling frequency.

In FIG. 6 the external clock connects directly to the ADC. In FIG. 7 a narrow bandpass filter centered at 150 MHz removes excess clock noise prior to the ADC sampling process. This filter reduces the noise floor by more than 15 dB over a large bandwidth. As in the case of IF frequency selection, the SI architecture offers access to module ports that can be used to greatly enhance system performance. Legacy systems provide no vehicle to improve ADC performance.

Figure 8:
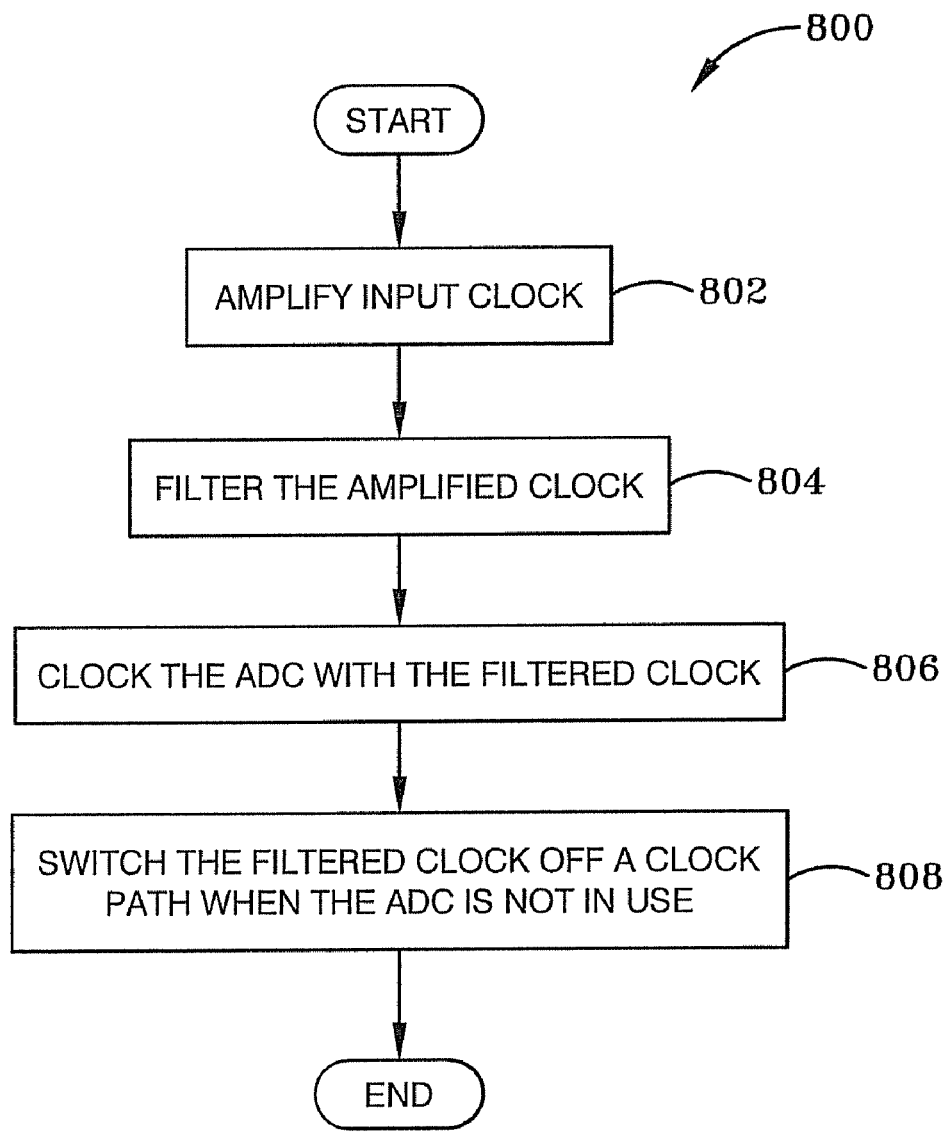
FIG. 8 illustrates a second embodiment that is a method for amplifying and filtering a sampling clock of a SI system.

FIG. 8 illustrates a second embodiment of a method 800 of frequency planning a SI system. This second embodiment improves the clocking of an analog-to-digital converter (ADC) in a synthetic instrument to improve the noise floor and dynamic range of a synthetic instrument system. The method 800 begins by amplifying an input clock, at 802, to produce an amplified clock. This amplified clock is then filtered to produce a filtered clock, at 804. Preferably, the amplified clock is filtered with a narrow bandpass filter that can be a second order filter. The ADC of the synthetic instrument is clocked with the filtered clock, at 806. The ADC samples input data at a sampling frequency. The input data is carried by an intermediate frequency (IF) signal. The input data can have an input frequency that corresponds to a second or higher Nyquist zone so that the input frequency is above the sampling frequency of the ADC. The method 800 switches the filtered clock off a clock path of the ADC, at 808, when the ADC is not in use. When there is input data for ADC to filter, the method 800 switches the filter clock onto the clock path of the ADC so that the ADC can sample the input data. As previously mentioned, this switching can improve the noise floor of more than 15 dB over a significant bandwidth.

In another configuration of this embodiment, a method 800 clocks the ADC that is an ADC formed with integrated circuits in a silicon chip. In this configuration, the amplifying, at 802, amplifies an input clock that is received externally from the chip. In one configuration of this embodiment, the method 800 can select a center IF which carries the data input to the ADC. The ADC can then sample the input data at the center IF. The method 800 can then also select the input clock based, at least in part, on the center IF.

Figure 9:
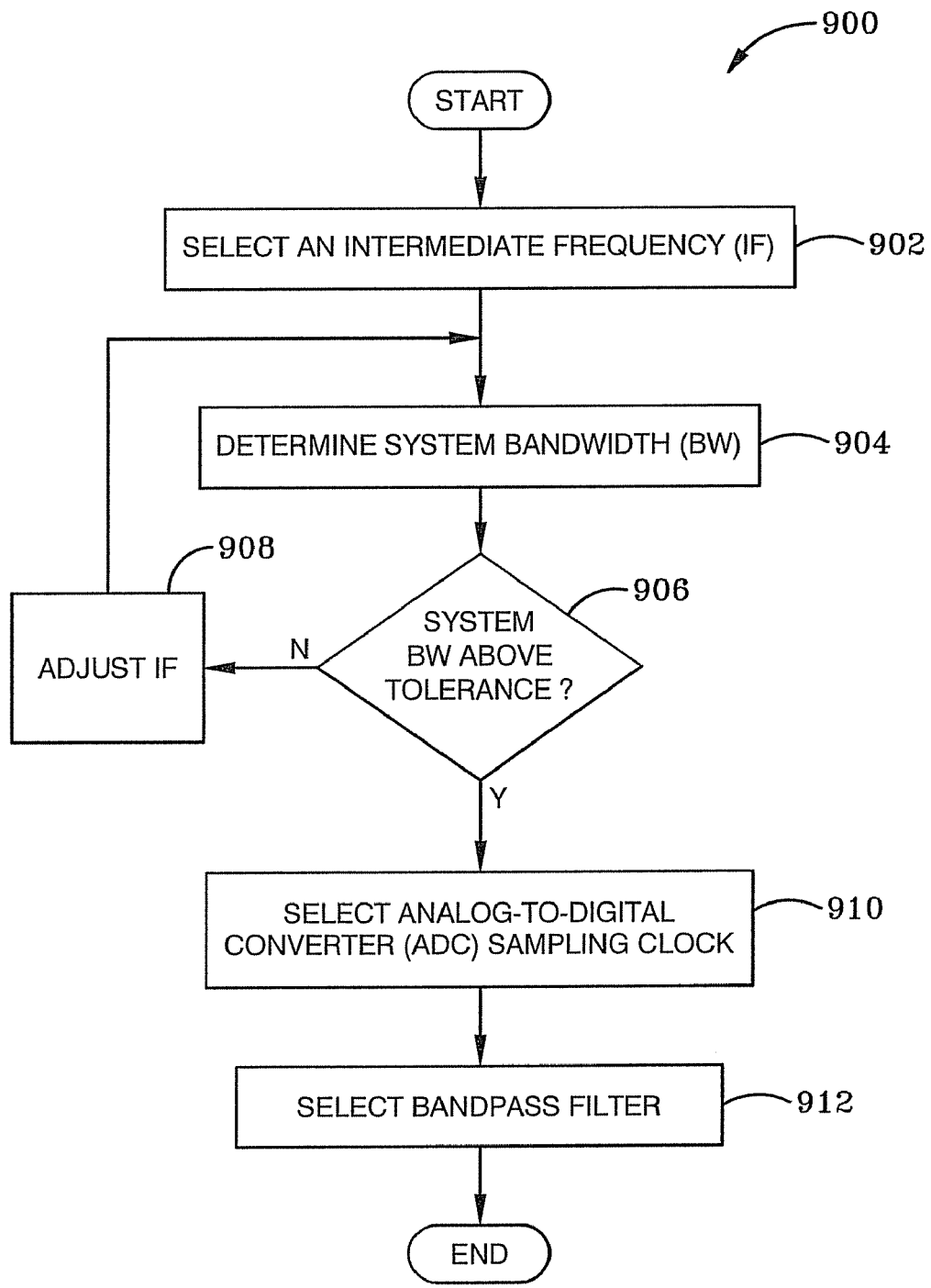
FIG. 9 illustrates a third embodiment that is a method for filtering a sampling clock of a SI system.

FIG. 9 illustrates a second embodiment method 900 for frequency planning a synthetic instrument unit. The method 900 begins by selecting an intermediate frequency (IF) that is carrying input data, at 902. The frequency is selected based on the architecture of synthetic instrumentation units such as receivers, filters, antennas, mixers and other components as understood by those of ordinary skill in the art. Selecting the IF can be an iterative process that is successful when the system bandwidth, the dynamic range (DR), sampling clock of an ADC and other features of the SI are radically synchronized.

A system bandwidth (BW) of the synthetic instrument unit is determined at 904. Next, a determination is made to determine if the system bandwidth (BW) is above a first tolerance, at 906. The IF is adjusted, at 908, when the system BW is not above the first tolerance to produce an updated IF. When the system BW is above the first tolerance, the method 900 selects an analog-to-digital converter (ADC) sampling clock, at 910. This clock is selected based, at least in part, on the updated IF. A bandpass filter is selected, at 912, to filter the ADC sampling clock based, at least in part, on the ADC sampling clock frequency. The bandpass filter may be a narrowband filter.

In other configurations of the third embodiment, an amplifier is selected that is capable of amplifying the ADC sampling clock prior to filtering the ADC sampling clock. An ADC can also be selected based on the IF where the ADC can be used to filter the input data based on the ADC sampling clock frequency. The IF and the ADC sampling clock can be selected so that the IF has a frequency that is about four times greater than the ADC sampling clock frequency.

In addition to determining if the BW is satisfactory, at 906, the method 900 can also determine if a BW of the ADC is satisfactory. If the system BW is not satisfactory, then the IF is adjusted to produce an updated IF. The determining if the BW of the ADC is within a BW window is performed after selecting an intermediate IF. The method 900 can also determine if the dynamic range (DR) of the input data is satisfactory. The IF is adjusted when the DR is not within the DR window to produce an updated IF.

In summary, there are several options to consider when configuring a synthetic instrument. Which ADC to use, selecting the system IF and bandwidth, ADC clock source (internal or external) and sampling frequency, how to filter the input signals prior to the ADC—all of these choices can have a profound effect on the total SI system performance.

The SI concept offers the flexibility to improve the system because it offers access to the component interface. The designer can coordinate the frequency plan to minimize spurious signal opportunities and not compromise the IF bandwidth. The frequency plan can be changed to suit the mode of operation maintaining the best measurement characteristics for each operating mode. Filtering can also be added to improve noise characteristics of the ADC. These options, however, are not liabilities. Instead, they offer avenues to improve and keep improving the SI's dynamic range over the legacy hardware suite.

In the foregoing description, certain terms have been used for brevity, clearness, and understanding. No unnecessary limitations are to be implied therefrom beyond the requirement of the prior art because such terms are used for descriptive purposes and are intended to be broadly construed. Therefore, the invention is not limited, to the specific details, the representative embodiments, and illustrative examples shown and described. Thus, this application is intended to embrace alterations, modifications, and variations that fall within the scope of the appended claims.

Moreover, the description and illustration of the invention is an example and the invention is not limited to the exact details shown or described. References to "the preferred embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in the preferred embodiment" does not necessarily refer to the same embodiment, though it may.

What is claimed is:

1. A method of clocking an analog-to-digital converter (ADC) in a synthetic instrument unit comprising:
   amplifying an input clock to an amplifier to produce an amplified clock;
   filtering the amplified clock to produce a filtered clock;
   clocking the ADC of the synthetic instrument unit with the filtered clock, wherein the ADC samples input data at a sampling frequency, wherein the input data is received at the ADC at an input frequency corresponding to an intermediate frequency (IF) signal; and
   switching the filtered clock off a clock path of the ADC when the ADC is not sampling input data.

2. The method of claim 1 wherein the filtering further comprises:
   filtering the amplified clock with a narrow bandpass filter.

3. The method of claim 1 wherein the filtering further comprises:
   filtering the amplified clock with at least a second order narrowband filter.

4. The method of claim 1 wherein clocking the ADC further comprises:
   clocking the ADC that is an ADC formed with integrated circuits in a silicon chip.

5. The method of claim 4 wherein amplifying the input clock further comprises:
   amplifying the input clock that is received externally from the chip.

6. The method of claim 1 wherein the input frequency of the ADC is a second or higher Nyquist zone that is above the sampling frequency of the ADC.

7. The method of claim 1 further comprising:
   selecting a center IF of the input data, wherein the ADC is to sample the input data at the center IF; and
   selecting the input clock based, at least in part, on the center IF.

8. The method of claim 1 further comprising:
   determining if the dynamic range (DR) of the IF signal is within a DR window; and
   adjusting the IF signal when the DR is not within the DR window to produce the updated IF signal.

9. A method for frequency planning a synthetic instrument system comprising:
   selecting an intermediate frequency (IF) of an input data;
   determining if a system bandwidth (BW) is above a tolerance at the IF;
   adjusting the IF when the system BW is not the above the tolerance to produce an updated IF;
   selecting an analog-to-digital converter (ADC) sampling clock frequency of an ADC sampling clock based, at least in part, on the updated IF; and
   selecting a bandpass filter to filter the ADC sampling clock based, at least in part, on the ADC sampling clock frequency.

10. The method for frequency planning of claim 9 further comprising:
    selecting an amplifier to amplify the ADC sampling clock prior to filtering the ADC sampling clock.

11. The method for frequency planning of claim 9 further comprising:

selecting an ADC based on the updated IF, wherein the ADC is to filter the input data based on the ADC sampling clock frequency.

12. The method for frequency planning of claim 9 further comprising:
    determining if a BW of the ADC is within a BW window; and
    adjusting the IF when the BW of the ADC is not within the BW window to produce the updated IF.

13. The method for frequency planning of claim 12 wherein the determining if the BW of the ADC is within a BW window is performed after the selecting an intermediate IF.

14. The method for frequency planning of claim 9 further comprising:
    determining if the dynamic range (DR) of the input data is within a DR window; and
    adjusting the IF when the DR of the input data is not within the DR window to produce the updated IF.

15. The method for frequency planning of claim 9 further comprising:
    selecting the filter for filtering the ADC sampling clock prior to sampling the updated IF with an ADC.

16. The method for frequency planning of claim 9 wherein the selecting the filter further comprises:
    selecting a narrowband bandpass filter to filter the ADC sampling clock.

17. The method for frequency planning of claim 9 wherein selecting the IF and selecting the ADC sampling clock further comprises:
    selecting the IF and the ADC sampling clock so that the IF has a frequency that is about four times greater than the ADC sampling clock frequency.

18. The method for frequency planning of claim 9 further comprising:
    selecting an ADC based on the updated IF, wherein the ADC is to filter the input data based on the ADC sampling clock frequency; and
    implementing the ADC and the bandpass filter in one or more silicon chips mounted on a printed circuit board.

19. A synthetic instrument logic comprising:
    an analog-to-digital converter (ADC) configured to digitally sample input data at an intermediate frequency (IF);
    an amplifier configured to amplify an input clock to create an amplified clock;
    a narrow bandpass filter configured to filter the amplified clock to create a filtered clock with a frequency corresponding to the frequency of the input, wherein the filtered clock is used to clock the ADC, wherein the amplified clock is filtered before being input to the ADC;
    switch logic configured to connect the filtered clock to the ADC and to disconnect the filtered clock to the ADC; and
    control logic configured to control the switching logic to connect the filter clock to the ADC when the ADC is to sample the input data and to disconnect the filter clock from the ADC when there is no input data to sample.

20. The synthetic instrument logic of claim 19 wherein the ADC further comprises:
    an input frequency, wherein the input frequency is in a Nyquist zone above the frequency of filtered clock.

* * * * *